(12) United States Patent
Layne

(10) Patent No.: US 7,599,674 B2
(45) Date of Patent: Oct. 6, 2009

(54) OVERLOAD PROTECTION FOR RECEIVER FRONT END

(75) Inventor: Dennis Ray Layne, Forest, VA (US)

(73) Assignee: Pine Valley Investments, Inc., Las Vegas, NV (US)

( * ) Notice: Subject to any disclaimer, the term of this patent is extended or adjusted under 35 U.S.C. 154(b) by 480 days.

(21) Appl. No.: 11/487,869

(22) Filed: Jul. 17, 2006

(65) Prior Publication Data

US 2008/0014888 A1    Jan. 17, 2008

(51) Int. Cl.
    *H04B 1/16*    (2006.01)

(52) U.S. Cl. .............. 455/217; 455/226.2; 455/334; 455/249.1; 455/222; 455/223; 375/346; 375/356; 375/130

(58) Field of Classification Search ........... 455/217, 455/226.2, 334, 249.1, 222, 223, 296; 375/346, 375/356, 130
See application file for complete search history.

(56) References Cited

U.S. PATENT DOCUMENTS

| | | | |
|---|---|---|---|
| 4,158,814 A | 6/1979 | Imazeki et al. | |
| 4,635,297 A | 1/1987 | Polischuk | |
| 4,688,041 A * | 8/1987 | Cronson et al. | 342/17 |
| 4,695,752 A * | 9/1987 | Ross et al. | 327/18 |
| 5,742,899 A | 4/1998 | Blackburn et al. | |
| 5,901,172 A | 5/1999 | Fontana et al. | |
| 6,122,332 A * | 9/2000 | Ogata et al. | 375/346 |
| 6,298,226 B1 | 10/2001 | Lloyd et al. | |
| 6,614,806 B1 | 9/2003 | Nanni | |
| 6,670,901 B2 | 12/2003 | Brueske et al. | |
| 6,850,119 B2 | 2/2005 | Arnott | |
| 6,885,852 B2 | 4/2005 | Hughes et al. | |
| 7,088,795 B1 * | 8/2006 | Aiello et al. | 375/356 |
| 7,209,523 B1 * | 4/2007 | Larrick et al. | 375/295 |
| 2003/0207676 A1 | 11/2003 | Hughes et al. | |
| 2004/0061555 A1 * | 4/2004 | Lynch | 330/136 |
| 2005/0287976 A1 | 12/2005 | Burgener et al. | |

\* cited by examiner

*Primary Examiner*—Sanh D Phu
(74) *Attorney, Agent, or Firm*—Allen, Dyer, Doppelt, Milbrath & Gilchrist, P.A.

(57) ABSTRACT

An embodiment is a receiver for a communications system that may substantially block unwanted signals in a frequency range to protect the receiver from overload. Simultaneously, the receiver of an embodiment substantially passes a desired signal so that its information may be processed by the, for example, communications system of which the receiver is part.

12 Claims, 6 Drawing Sheets

OVERLOAD PROTECTION FOR RECEIVER FRONT END

BACKGROUND

Modern wireless communication systems may operate both in analog and digital modes in frequency ranges allocated according to the Federal Communications Commissions (FCC). In particular, a digital wireless communications system may operate according to Institute of Electrical and Electronics Engineers (IEEE) standards such as the 802.11 standards for Wireless Local Area Networks (WLANs) and the 802.16 standards for Wireless Metropolitan Area Networks (WMANs). Worldwide Interoperability for Microwave Access (WiMAX) is a wireless broadband technology based on the IEEE 802.16 standard of which IEEE 802.16-2004 and the 802.16e amendment are Physical (PHY) layer specifications.

Wireless communications systems, for example those operating to the IEEE 802.11 and 802.16 standards, may share frequency ranges allocated by the FCC. Further, Land Mobile Radio may operate in another allocated frequency range. A receiver for the wireless communication system should be sensitive to a desired signal within the frequency range while simultaneously blocking unwanted signals that may interfere with the reception of the desired signal.

SUMMARY

One embodiment may comprise a receiver including a filter to filter a desired signal from a signal. The receiver may further include a detector coupled to the filter to detect a strength of the signal and a strength of the desired signal. The receiver may also include a controller coupled to the detector to compare the strength of the signal and the strength of the desired signal. Other embodiments are described and claimed.

DETAILED DESCRIPTION

Figure 1:
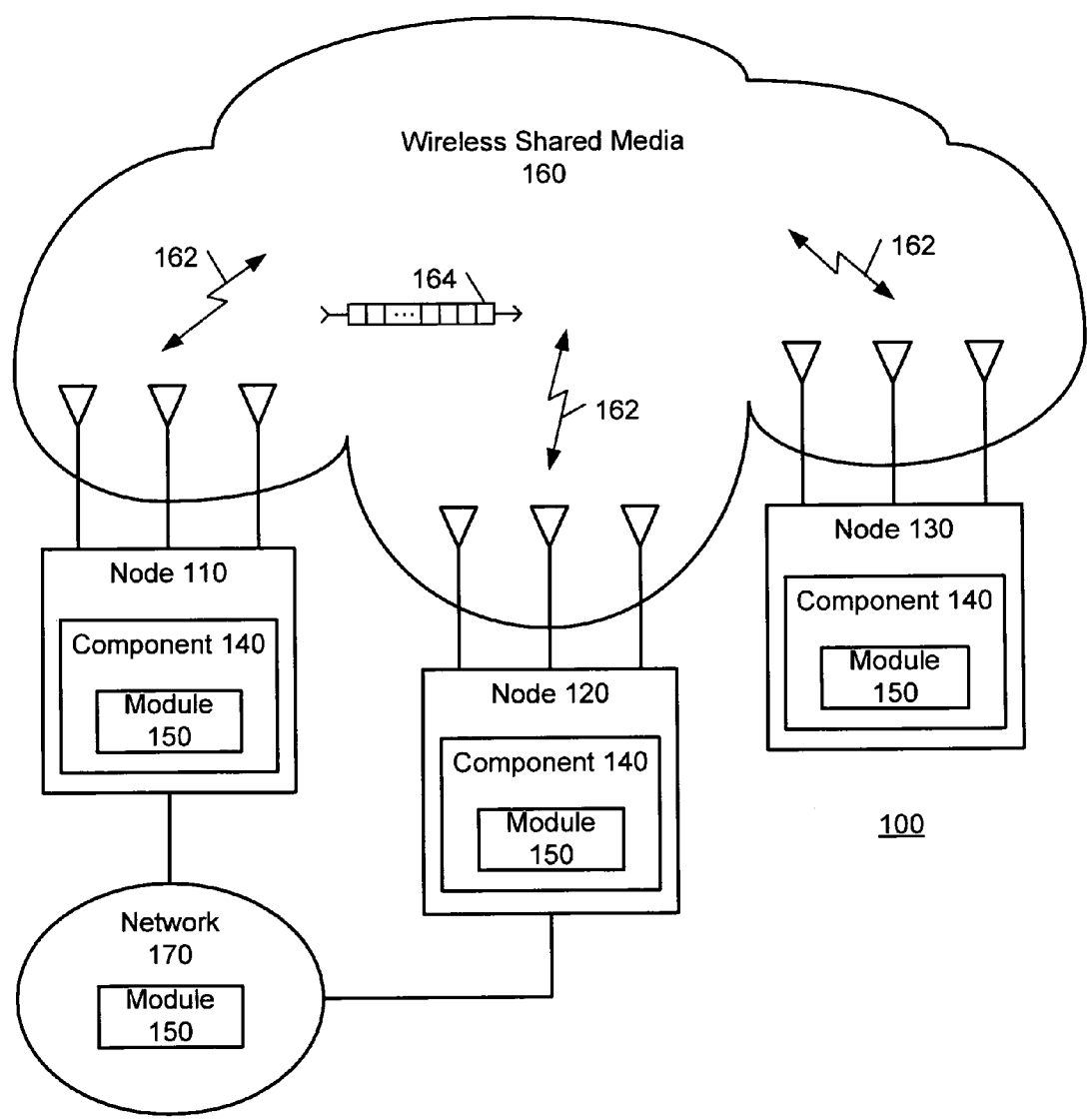
FIG. 1 illustrates a wireless system.

An embodiment is a receiver for a communications system that may substantially block unwanted signals in a frequency range to protect the receiver from overload. Simultaneously, the receiver of an embodiment substantially passes a desired signal so that its information may be processed by the, for example, communications system of which the receiver is part. More specifically, the receiver of an embodiment substantially passes the desired signal while substantially maintaining its sensitivity to a desired signal in the presence of an interfering signal or signals.

To do so, the receiver of an embodiment utilizes a variable attenuator that may be controlled. More specifically, based on the detection and comparison scheme, a controller may control a variable attenuator positioned after a first filter or filters that may collectively operate as a bandpass filter for an incident signal. For example, in an embodiment, the variable attenuator may be located following a preselector filter, low noise amplifier, and image filter as each may not be substantially prone to overload or distortion caused by a powerful incoming signal. Accordingly, they may not require the same protection from overload as other components downstream. The controller may compare the strength of a desired signal to the strength of the incident signal that may include a strong unwanted or jamming signal. Thereafter, the controller may control the variable attenuator to substantially block the unwanted signal to protect downstream components from overload while substantially maintaining the sensitivity of the receiver to the desired signal.

Embodiments of a communications system including a receiver front end to protect the receiver and communication system from overload and method of operation thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

One embodiment may include a receiver for a communications system that may substantially block unwanted signals in a frequency range to protect the receiver from overload. Simultaneously, the receiver of an embodiment substantially passes a desired signal so that its information may be processed by the, for example, communications system of which the receiver is part. More specifically, the receiver of an embodiment substantially passes the desired signal while substantially maintaining its sensitivity to a desired signal in the presence of an interfering signal or signals.

FIG. 1 illustrates an embodiment of a system. FIG. 1 illustrates a block diagram of a communications system 100. In various embodiments, the communications system 100 may comprise multiple nodes. A node generally may comprise any physical or logical entity for communicating information in the communications system 100 and may be implemented as hardware, software, or any combination thereof, as desired for a given set of design parameters or performance constraints. Although FIG. 1 may show a limited number of nodes by way of example, it can be appreciated that more or less nodes may be employed for a given implementation.

In various embodiments, a node may comprise, or be implemented as, a computer system, a computer sub-system, a computer, an appliance, a workstation, a terminal, a server, a personal computer (PC), a laptop, an ultra-laptop, a handheld computer, a personal digital assistant (PDA), a set top box (STB), a telephone, a mobile telephone, a cellular telephone, a handset, a wireless access point, a base station (BS), a subscriber station (SS), a mobile subscriber center (MSC), a radio network controller (RNC), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chip, a transistor, or any other device, machine, tool, equipment, component, or combination thereof. The embodiments are not limited in this context.

In various embodiments, a node may comprise, or be implemented as, software, a software module, an application, a program, a subroutine, an instruction set, computing code, words, values, symbols or combination thereof. A node may be implemented according to a predefined computer language, manner or syntax, for instructing a processor to perform a certain function. Examples of a computer language may include C, C++, Java, BASIC, Perl, Matlab, Pascal, Visual BASIC, assembly language, machine code, microcode for a network processor, and so forth. The embodiments are not limited in this context.

The nodes of the communications system 100 may be arranged to communicate one or more types of information, such as media information and control information. Media information generally may refer to any data representing content meant for a user, such as image information, video information, graphical information, audio information, voice information, textual information, numerical information, alphanumeric symbols, character symbols, and so forth. Control information generally may refer to any data representing commands, instructions or control words meant for an automated system. For example, control information may be used to route media information through a system, or instruct a node to process the media information in a certain manner. The media and control information may be communicated from and to a number of different devices or networks.

In various implementations, the nodes of the communications system 100 may be arranged to segment a set of media information and control information into a series of packets. A packet generally may comprise a discrete data set having fixed or varying lengths, and may be represented in terms of bits or bytes. It can be appreciated that the described embodiments are applicable to any type of communication content or format, such as packets, cells, frames, fragments, units, and so forth.

The communications system 100 may communicate information in accordance with one or more standards, such as standards promulgated by the IEEE, the Internet Engineering Task Force (IETF), the International Telecommunications Union (ITU), and so forth. In various embodiments, for example, the communications system 100 may communicate information according to one or more IEEE 802 standards including IEEE 802.11 standards (e.g., 802.11a, b, g/h, j, n, and variants) for WLANs and/or 802.16 standards (e.g., 802.16-2004, 802.16.2-2004, 802.16e, 802.16f, and variants) for WMANs. The communications system 100 may communicate information according to one or more of the Digital Video Broadcasting Terrestrial (DVB-T) broadcasting standard and the High performance radio Local Area Network (HiperLAN) standard. The communications system 100 may further communicate information according to standards for land mobile radio as promulgated by the Association of Public Safety Communications Officials (APCO) or any other land mobile radio standards. The embodiments are not limited in this context.

In various embodiments, the communications system 100 may employ one or more protocols such as medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), and so forth.

The communications system 100 may include one or more nodes (e.g., nodes 110-130) arranged to communicate information over one or more wired and/or wireless communications media. Examples of wired communications media may include a wire, cable, printed circuit board (PCB), backplane, switch fabric, semiconductor material, twisted-pair wire, coaxial cable, fiber optics, and so forth. An example of a wireless communication media may include portions of a wireless spectrum, such as the radio-frequency (RF) spectrum. In such implementations, the nodes of the system 100 may include components and interfaces suitable for communicating information signals over the designated wireless spectrum, such as one or more transmitters, receivers, transceivers, amplifiers, filters, control logic, antennas and so forth.

The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), a line card, a disc controller, video controller, audio controller, and so forth.

In various embodiments, the communications system 100 may comprise or form part of a network, such as a WiMAX network; a broadband wireless access (BWA) network, a WLAN, a WMAN, a wireless wide area network (WWAN), a wireless personal area network (WPAN), a Code Division Multiple Access (CDMA) network, a Wide-band CDMA (WCDMA) network, a Time Division Synchronous CDMA (TD-SCDMA) network, a Time Division Multiple Access (TDMA) network, an Extended-TDMA (E-TDMA) network, a Global System for Mobile Communications (GSM) network, an Orthogonal Frequency Division Multiplexing (OFDM) network, an Orthogonal Frequency Division Multiple Access (OFDMA) network, a North American Digital Cellular (NADC) network, a Universal Mobile Telephone System (UMTS) network, a third generation (3G) network, a fourth generation (4G) network, a local area network (LAN), a wide area network (WAN), a metropolitan area network (MAN), the Internet, the World Wide Web, a cellular network, a radio network, a satellite network, and/or any other communications network configured to carry data. The embodiments are not limited in this context.

The communications system 100 may employ various modulation techniques including, for example: OFDM modulation, Quadrature Amplitude Modulation (QAM), N-state QAM (N-QAM) such as 16-QAM (four bits per symbol), 32-QAM (five bits per symbol), 64-QAM (six bits per symbol), 128-QAM (seven bits per symbol), and 256-QAM (eight bits per symbol), Differential QAM (DQAM), Binary Phase Shift Keying (BPSK) modulation, Quadrature Phase Shift Keying (QPSK) modulation, Offset QPSK (OQPSK) modulation, Differential QPSK (DQPSK), Frequency Shift Keying (FSK) modulation, Minimum Shift Keying (MSK) modulation, Gaussian MSK (GMSK) modulation, and so forth. The embodiments are not limited in this context.

In various embodiments, the communications system 100 may be arranged to receive a signal. More specifically, the communications system 100 may be arranged to receive a desired signal while substantially blocking an unwanted signal. For example, within a range of signal frequencies, the communications system 100 may be exposed to any number of signal frequencies and signal powers. The communications system 100 may select a desired frequency or frequency range to properly receive a desired signal. To do so, the communications system 100 may have to be sensitive to signal frequencies in that particular range. However, the communications system 100 may further be overloaded by unwanted signals based on their power and/or their frequency proximity to the frequency of the desired signal. The communications system 100 of an embodiment may employ a receiver including variable attenuation that may be controlled by detecting the power of incident signal frequencies to substantially maintain sensitivity of the communications system 100 to the desired signal while simultaneously protecting the communications system 100 from overload caused by unwanted signals. In an embodiment, the communications system 100 may protect against overload while not substantially degrading its sensitivity to the desired signal relative to a communications system that does not include a receiver with variable attenuation.

In one embodiment, communications system 100 may include one or more wireless communication devices, such as nodes 110-130. Nodes 110-130 all may be arranged to communicate information signals using one or more wireless transmitters/receivers ("transceivers") or radios, which may involve the use of radio frequency communication via 802.16 schemes (e.g., 802.16-2004, 802.16.2-2004, 802.16e, 802.16f, and variants) for WMANs, or land mobile radio schemes, for example. Nodes 110-130 may communicate using the radios over wireless shared media 160 via multiple inks or channels established therein. Although FIG. 1 is shown with a limited number of nodes in a certain topology, it may be appreciated that communications system 100 may include additional or fewer nodes in any type of topology as desired for a given implementation. The embodiments are not limited in this context.

Further, nodes 110 and 120 may comprise fixed devices having wireless capabilities. A fixed device may comprise a generalized equipment set providing connectivity, management, and control of another device, such as mobile devices. Examples for nodes 110 and 120 may include a wireless access point (AP), base station or node B, router, switch, hub, gateway, media gateway, and so forth. In an embodiment, nodes 110 and 120 may also provide access to a network 170 via wired communications media. Network 170 may comprise, for example, a packet network such as the Internet, a corporate or enterprise network, a voice network such as the Public Switched Telephone Network (PSTN), among other WANs, for example. The embodiments are not limited in this context.

In one embodiment, system 100 may include node 130. Node 130 may comprise, for example, a mobile device or a fixed device having wireless capabilities. A mobile device may comprise a generalized equipment set providing connectivity to other wireless devices, such as other mobile devices or fixed devices. Examples for node 130 may include a computer, server, workstation, notebook computer, handheld computer, telephone, cellular telephone, personal digital assistant (PDA), combination cellular telephone and PDA, land mobile radio, and so forth.

Nodes 110-130 may have one or more wireless transceivers and wireless antennas. In one embodiment, for example, nodes 110-130 may each have multiple transceivers and multiple antennas to communicate information signals over wireless shared media 160. For example, a channel 162, link, or connection may be formed using one or more frequency bands of wireless shared medium 160 for transmitting and receiving packets 164. The embodiments are not limited in this context.

Figure 2:
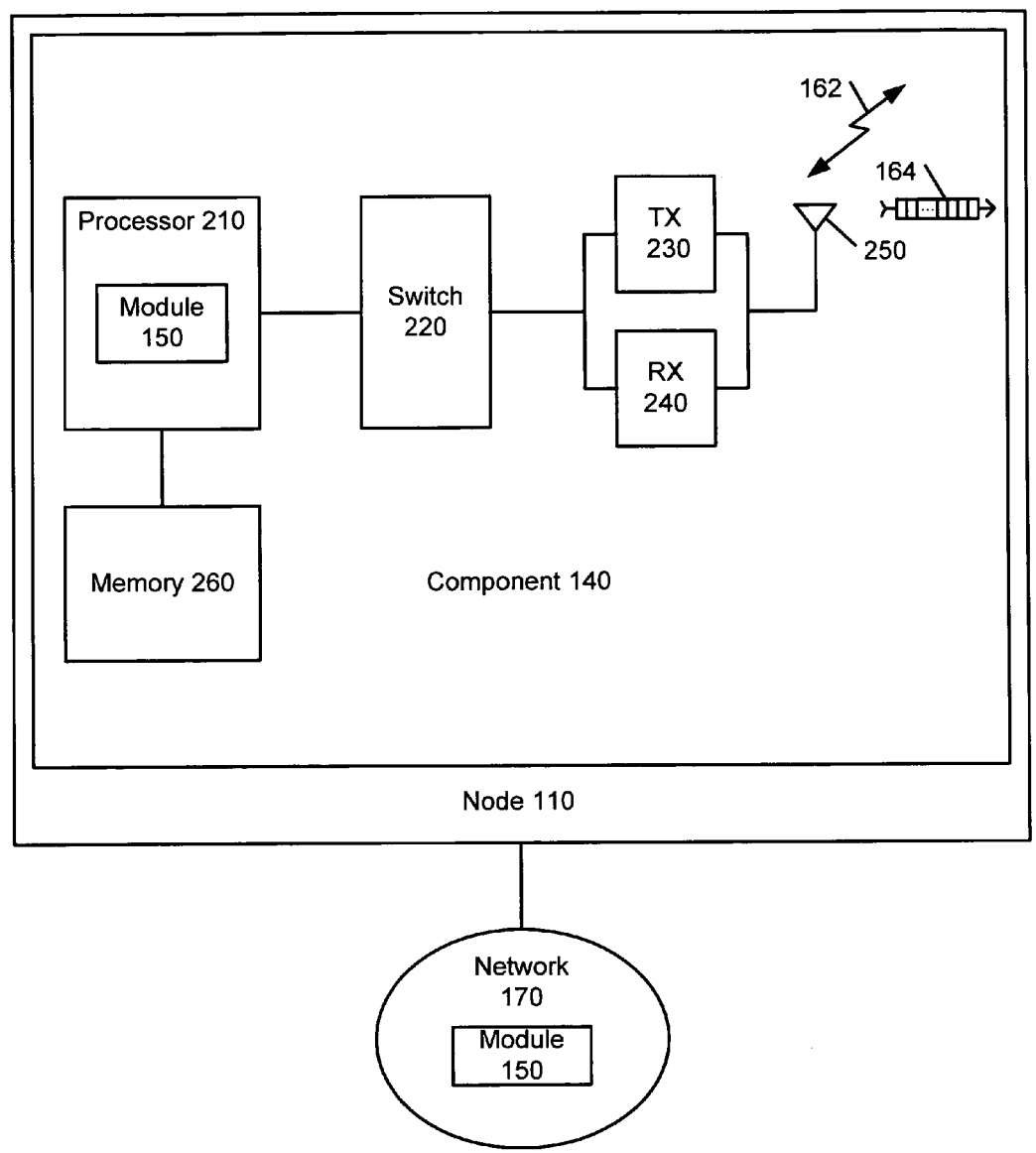
FIG. 2 illustrates a wireless system node.

FIG. 2 more specifically illustrates node 110 of the communications system 100. As shown in FIG. 2, the node may comprise multiple elements such as component 140, module 150, processor 210, memory 260, switch 220, transmitter 230, receiver 240, and antenna 250 to communicate packets 164 over wireless shared media 160. Transmitter 230 and receiver 240 may also be collectively referred to as a transceiver. Antenna 250 may include an internal antenna, an omni-directional antenna, a monopole antenna, a dipole antenna, an end fed antenna or a circularly polarized antenna, a micro-strip antenna, a diversity antenna, a dual antenna, an antenna array, and so forth. Some elements may be implemented using, for example, one or more circuits, components, registers, processors, software subroutines, or any combination thereof. Although FIG. 2 shows a limited number of elements, it can be appreciated that additional or fewer elements may be used in node 110 as desired for a given implementation. The embodiments are not limited in this context.

As noted, in an embodiment, node 110 may include a processor 210. Processor 210 may be connected to switch 220 and/or the transceiver (i.e., transmitter 230 and receiver 240). Processor 210 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In an embodiment, for example, processor 210 may be implemented as a general purpose processor. Processor 210 may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), a programmable logic device (PLD), and so forth. The embodiments are not limited in this context.

In one embodiment, processor 210 may include, or have access to, memory 260. Memory 260 may comprise any machine-readable media. Memory 260 may be implemented using any machine-readable or computer-readable media capable of storing data, including both volatile and non-volatile memory. For example, memory 260 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of memory 260 may be included on the same integrated circuit as processor 210, or alternatively some portion or all of memory 260 may be disposed on an integrated circuit or other medium, for example a hard disk drive, that is external to the integrated circuit of processor 210. The embodiments are not limited in this context.

When implemented in a node of communications system 100, node 110 may be arranged to communicate information over wireless communications media between the various nodes, such as nodes 120 and 130. The information may be communicated using in the form of packets 164 over wireless shared media 160, with each packet 164 comprising media information and/or control information. The media and/or control information may be represented using, for example, multiple Orthogonal Frequency Division Multiplexing (OFDM) symbols. A packet 164 in this context may refer to any discrete set of information, including a unit, frame, cell, segment, fragment, and so forth. The packet may be of any size suitable for a given implementation. The embodiments are not limited in this context.

FIG. 3 through FIG. 6 more specifically describe, for example, the receiver 240 of the communications system 100 and/or node 110 and method of operation thereof. In particular, FIG. 3 through FIG. 6 describe the receiver 240 of an embodiment as part of a land mobile radio. As introduced, land mobile radio refers to a radio operating according to APCO, Telecommunications Industry Association (TIA), or other similar land mobile radio standard. The APCO standards, for example, were established to address the need for common digital public safety radio communications standards for First Responders and Homeland Security/Emergency Response professionals (e.g., police, paramedic, fire, military, or any other state or federal emergency response organizations). In an embodiment, land mobile radio is allocated numerous frequency ranges commonly within the 400-900 MHz range, though other frequency ranges may also be allocated.

Figure 3:
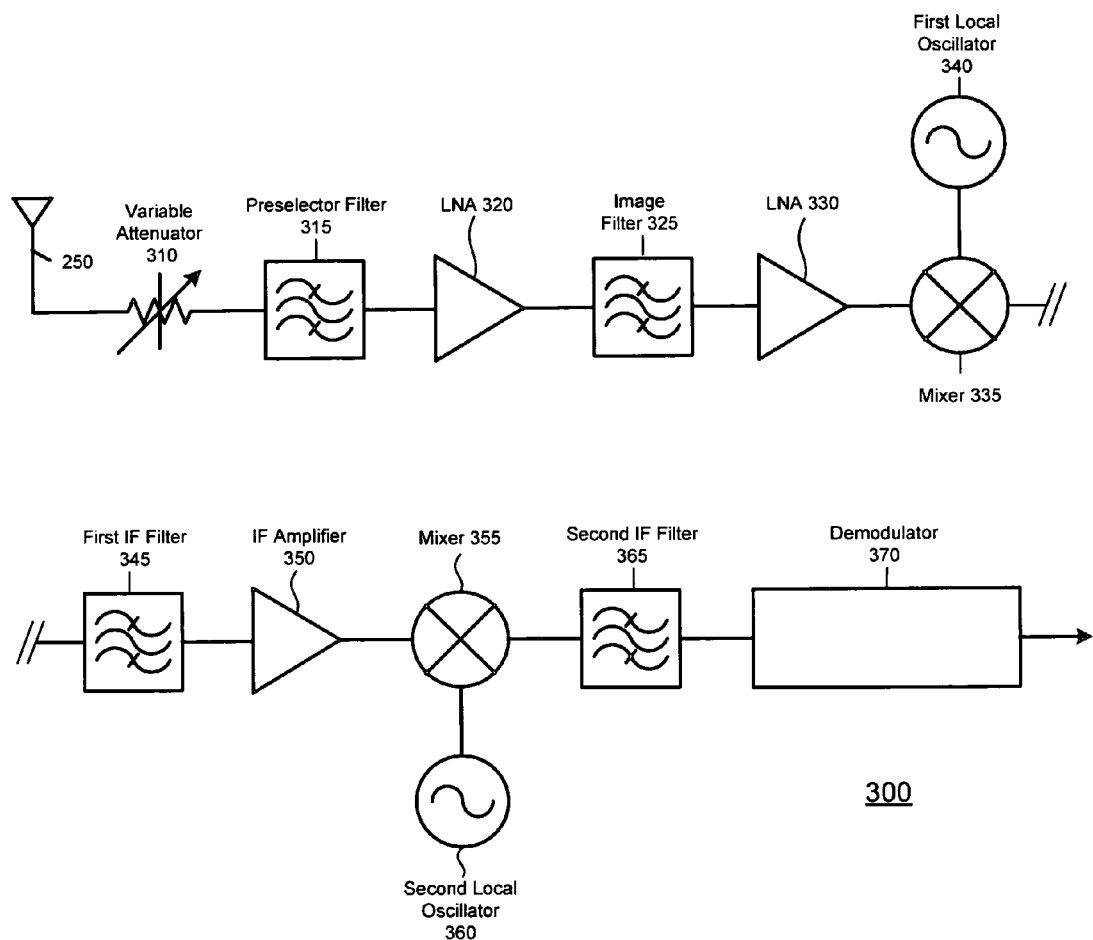
FIG. 3 illustrates a receiver of an embodiment.

For example, FIG. 3 illustrates the details of receiver 300 (representative of receiver 240) of an embodiment coupled to antenna 250. In an embodiment, the receiver 300 is illustrated from antenna 250 through a demodulator 370. The receiver 300 may include a variable attenuator 310 in front of, for example, a preselector filter 315, a low noise amplifier (LNA) 320, an image filter 325 an another LNA 330. Thereafter, a filtered signal may be mixed at mixer 335 with a signal from first local oscillator 340 and filtered with a first intermediate frequency (IF) filter 345 and amplified by IF amplifier 350. The signal may be mixed again at mixer 355 with the signal from a second local oscillator 360. After the output of mixer 355 is filtered with a second IF filter 365, a demodulator 370 may demodulate the signal. As configured, the variable attenuator 310 may be adjusted such that powerful incoming signals may be substantially prevented from overloading subsequent receiver 300 circuit elements. However, as the attenuation applies to all incident signals, the variable attenuator 310 may simultaneously degrade the sensitivity of the receiver 300 to a desired signal.

Figure 4:
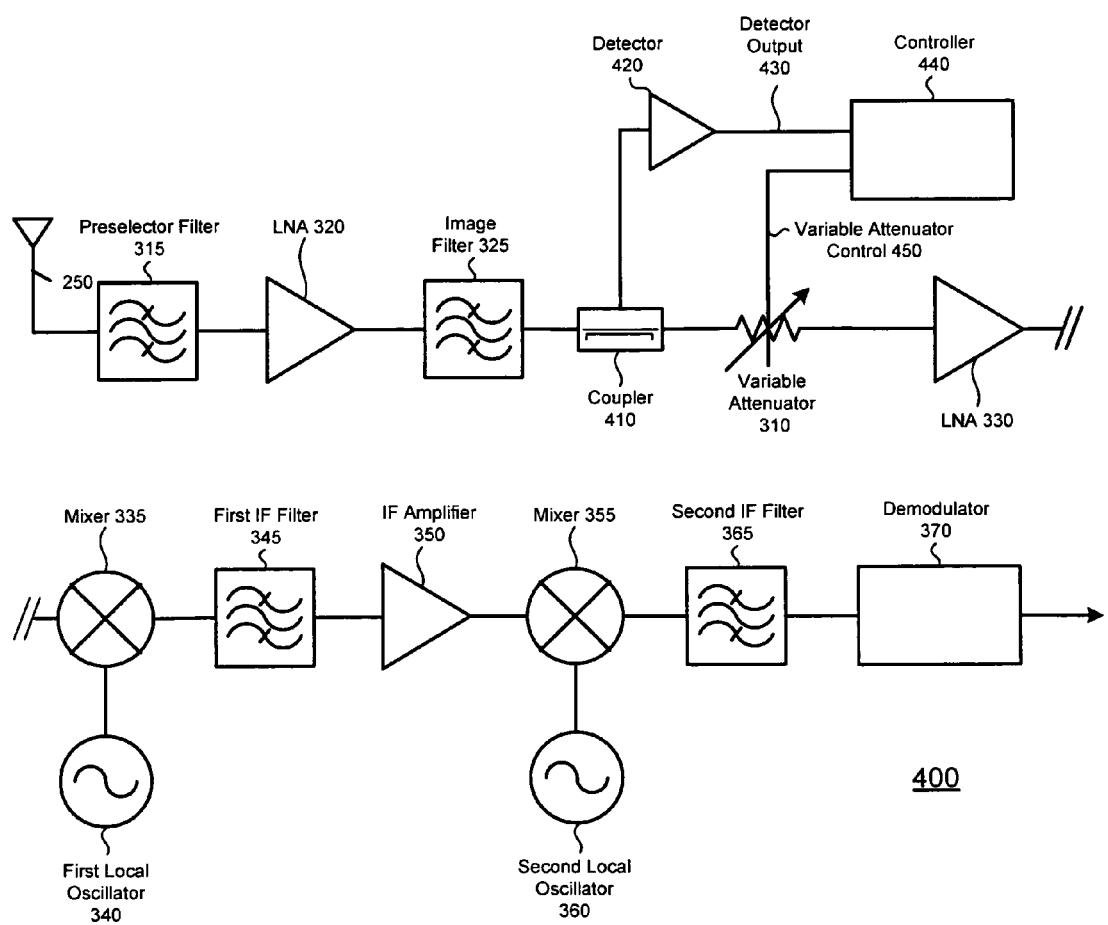
FIG. 4 illustrates a receiver of an embodiment.

FIG. 4 illustrates the receiver 400 of an embodiment to improve the sensitivity of the receiver 400 to a desired signal, and in particular when the receiver 400 is in the presence of multiple incident signals. As will be described, the receiver 400 of an embodiment may employ a detection and comparison scheme to control a variable attenuator positioned at a different location in the receiver component chain compared to receiver 300. For example, in an embodiment, the receiver 400 does not include the variable attenuator between the antenna 250 and the preselector filter 315. Instead, the receiver 400 of an embodiment includes the variable attenuator 310 located beyond the preselector filter 315, LNA 320, and image filter 325. In an embodiment, the preselector filter 315, LNA 320, and image filter 325 may not be substantially prone to overload or distortion caused by a powerful incoming signal. Accordingly, they may not require the same protection from overload as other components downstream such as LNA 330 and subsequent components of an embodiment. Compared to receiver 300, receiver 400 may substantially block an unwanted strong signal while not substantially decreasing the sensitivity of the receiver 400 with respect to a desired signal based on the location of the variable attenuator 410. It is to be understood that an embodiment may include other downstream components not illustrated that may benefit from the insertion of the variable attenuator 410 and the overload protection it provides.

The variable attenuator 410 may be controlled via variable attenuator control 450 coupled to controller 440. In the presence of multiple signals, the receiver 400 may first detect whether or not a non-desired, high-powered signal (also called a jamming signal) is present. To determine the presence of a jamming signal, following the preselector filter 315, LNA 320, and image filter 330 (i.e., the bandpass filters of receiver 240), the receiver 400 includes a directional coupler 410. The power of the signal coupled by directional coupler 410 of an embodiment may be measured by detector 420. The detector 420 of an embodiment may output a voltage as output 430 that may increase as the input signal strength (i.e., the strength of the signal following antenna 250) approaches a power level that may cause compression in the receiver 400. The output 360 voltage may be thereafter converted to a digital level that may then be coupled to a controller 440. The receiver 400 may further measure the strength of the desired signal. More specifically, the signal may be measured at or after the demodulator 370 such that the signal power measured is that substantially only from the desired signal and not from any adjacent signals. The power of the desired signal may then also be coupled to the controller 440. The controller 440 may thereafter compare the two signal strengths to determine whether or not the strong jamming signal (i.e., signal before filtering) is the same as the desired signal (i.e., signal after filtering). For example, if the two signal strengths are substantially the same, then strong signal is the desired signal. However, if the strength of the desired signal is substantially less than the strength of the strong signal, then the strong signal may interfere with the receipt of the desired signal.

In an instance for which the strong signal is not the desired signal, the controller 400 may then, based on the measurement of the signal strength of the desired signal, determine whether the signal strength of the desired signal exceeds a threshold strength. In an embodiment, the threshold strength is relative to the sensitivity limit of the receiver 400. The variable attenuator 410 may be adjusted based on the comparison of the strength of the strong jamming signal and the strength of the desired signal and on the strength of the desired signal relative to the threshold strength, to decrease the overall signal strength experienced by the receiver 400 to protect the components downstream from the variable attenuator 410. Furthermore, the attenuation may be simultaneously limited such that the strength of the desired signal is not decreased below the detection or sensitivity limit of the receiver 400.

As noted, the location of the variable attenuator 410 of receiver 400 may substantially block an unwanted strong, or jamming, signal while not substantially decreasing the sensitivity to the desired signal as compared to receiver 300. More specifically, the variable attenuator 410 may operate on the desired signal (e.g., signal after filter) versus the signal received at antenna 250. Accordingly, if the desired signal is a strong signal, the voltage variable attenuator 410 may be controlled via variable attenuator control 440 to attenuate the signal to protect downstream components (e.g., LNA 420, mixer 430, and other components). However, if the desired signal is weak, there may not be any attenuation as the downstream components may not be at risk of overload or operating conditions that may cause distortion or other undesirable nonlinear component behavior.

Figure 5:
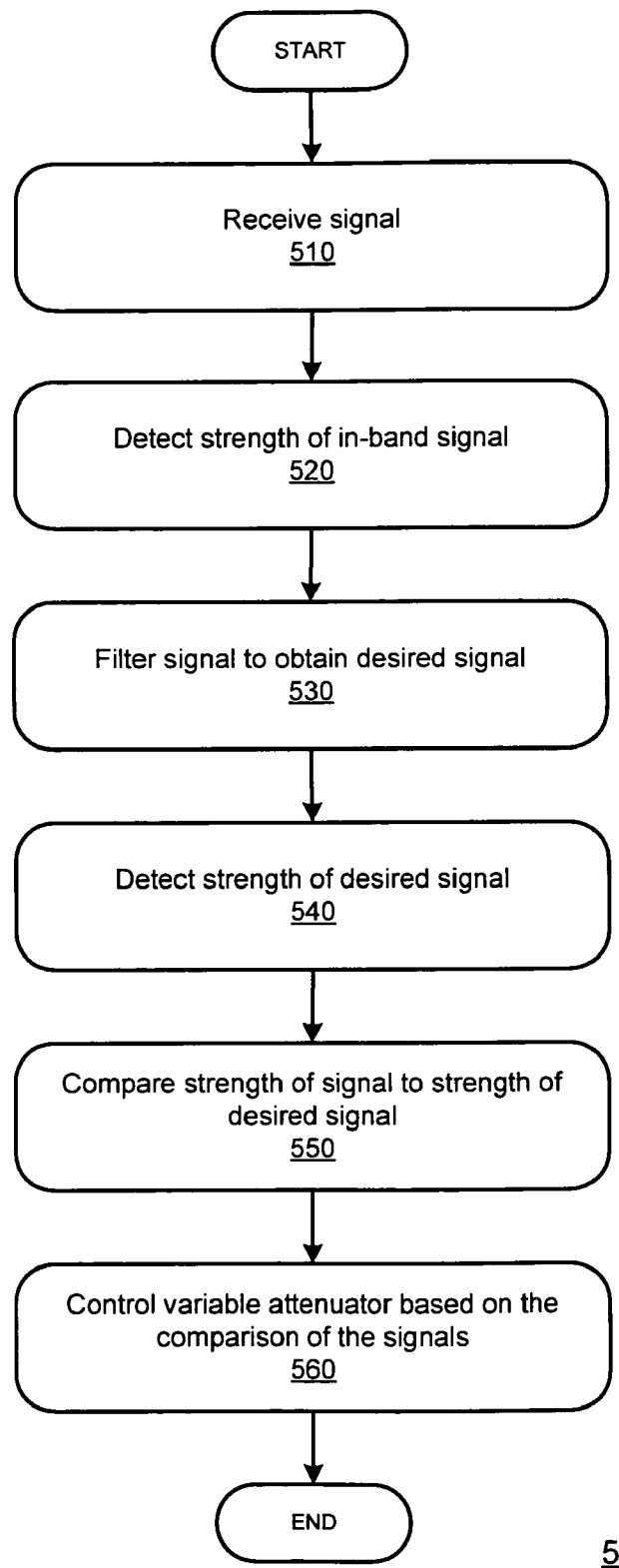
FIG. 5 illustrates a logic flow of an embodiment.

FIG. 5 illustrates the logic flow of an embodiment. At 510, a signal is received. At 520, the strength of the in-band signal is detected. Thereafter, at 530 the signal is filtered to obtain a desired signal. For example, in an embodiment the signal is filtered with a bandpass filter or combination of filters such that substantially only a signal with a desired frequency or frequency range is passed. At 540, the strength of the desired signal (i.e., signal after the filter) is detected. At 550, the strength of the incoming signal is compared to the strength of the desired signal (i.e., signal after the filter). In an embodiment, the comparison at 550 indicates whether or not the incoming signal is substantially the desired signal, or whether the incoming signal includes a strong non-desired or jamming signal that may interfere with the detection of the desired signal. At 560, a variable attenuator may be controlled based on the comparison at 550 to attenuate the signal. In an embodiment, controlling the variable attenuator may protect downstream amplifiers, mixers, and other components from overload. Further, in an embodiment, the response time of the variable attenuator control loop may be adjusted so that it differs from the response time of other automatic gain control functions built into the receiver to substantially avoid oscillation within the receiver.

Figure 6:
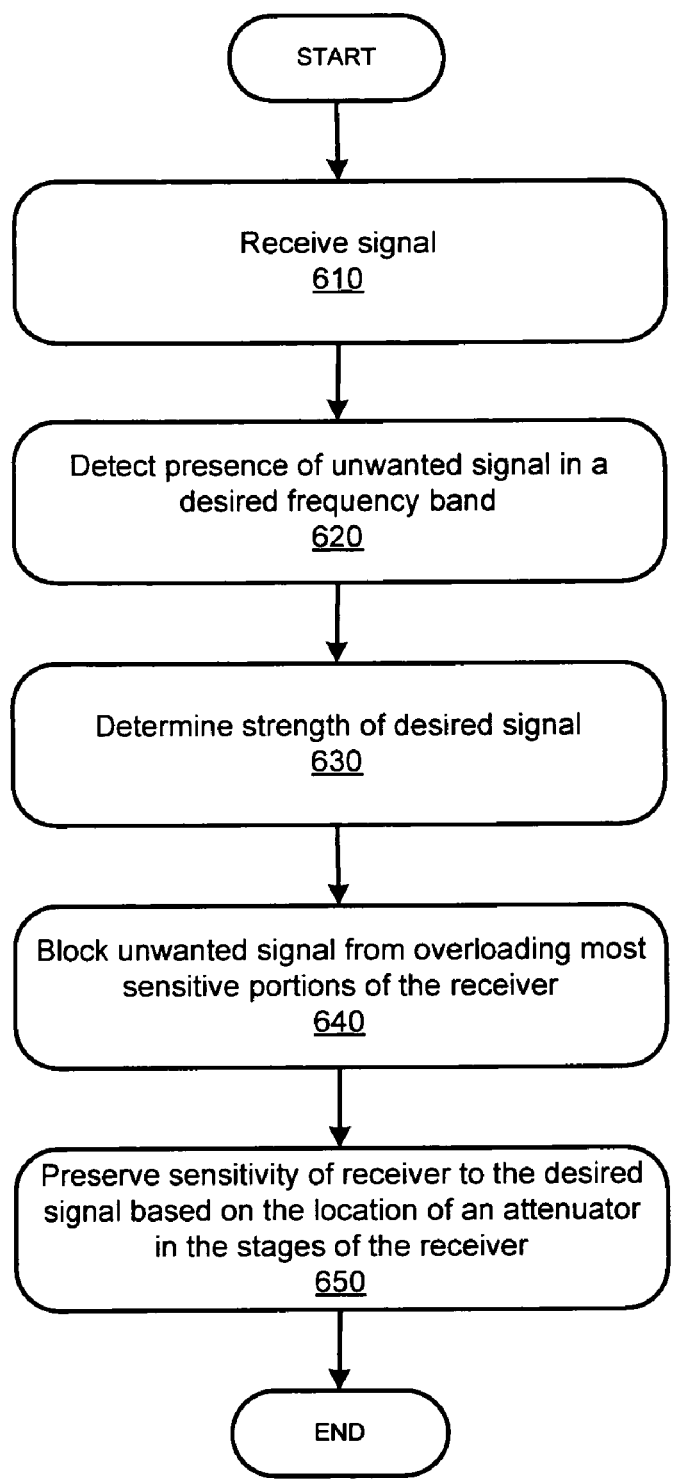
FIG. 6 illustrates a logic flow of an alternate embodiment.

FIG. 6 illustrates the logic flow of an alternate embodiment. At 610 a signal is received at a receiver. At 620, the receiver detects the presence of an unwanted signal, or jamming signal, in a desired frequency band. At 630, the receiver further determines the strength of a desired signal within the same frequency band. Thereafter at 640, the receiver, based on the presence and strength of the unwanted signal as well as the strength of the desired signal, substantially block the unwanted signal from overloading sensitive portions of the receiver. In an embodiment, the receiver substantially blocks the unwanted signal by controlling an attenuator located before the sensitive portions of the receiver. Further, at 650, the receiver preserves its sensitivity to the desired signal based on the location of the attenuator in the stages of the receiver. For example, (and as illustrated by FIG. 4) the attenuator may be located after a first set of filters (e.g., preselector filter 315, LNA 320, and image filter 325) but before more sensitive downstream components.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, also may mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, such as the examples given with reference to FIG. 2. For example, the memory unit may include any memory device, memory article, memory medium, storage device, storage article, storage medium and/or storage unit, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

What is claimed is:

1. An receiver comprising:
a filter to filter a desired signal from a signal;
a detector coupled to the filter to detect a strength of the signal and a strength of the desired signal; and
a controller coupled to the detector to compare the strength of the signal and the strength of the desired signal and to control a variable attenuator coupled to the filter, the variable attenuator controlled based on the comparison of the signal and the desired signal and based on a comparison of the desired signal and a threshold signal.

2. The receiver of claim 1, the variable attenuator coupled to the filter upstream from the filter.

3. The receiver of claim 1, the variable attenuator coupled to the filter downstream from the filter.

4. The receiver of claim 1 further comprising:
a coupler to couple the filter to the detector.

5. A communications system comprising:
a communications medium; and
a receiver including
a filter to filter a desired signal from a signal;
a detector coupled to the filter to detect a strength of the signal and a strength of the desired signal; and
a controller coupled to the detector to compare the strength of the signal and the strength of the desired signal and to control a variable attenuator coupled to the filter, the variable attenuator controlled based on the comparison of the signal and the desired signal and based on a comparison of the desired signal and a threshold signal.

6. The communications system of claim 5, the variable attenuator coupled to the filter upstream from the filter.

7. The communications system of claim 5, the variable attenuator coupled to the filter downstream from the filter.

8. The communications system of claim 5, the receiver further comprising:

a coupler to couple the filter to the detector.

9. A method comprising:

receiving a signal at a receiver;

detecting the presence of an unwanted signal in a frequency band;

determining the strength of a desired signal in the frequency band;

comparing the strength of the unwanted signal to the strength of the desired signal;

substantially blocking the unwanted signal from overloading a sensitive component in the receiver by filtering the signal and by attenuating, with a variable attenuator, the signal before the sensitive component of the receiver and after the filtering; and substantially preserving the sensitivity of the receiver to the desired signal;

wherein the variable attenuator is controlled based on the comparison of the undesired signal and the desired signal and based on a comparison of the desired signal and a threshold signal.

10. An article comprising a machine-readable storage medium containing instructions that if executed enable a communications system to:

receive a signal;

detect a strength of the signal;

filter the signal to obtain a desired signal;

detect a strength of the desired signal;

compare the strength of the signal to the strength of the desired signal; and control a variable attenuator based on the comparison of the strength of the signal to the strength of the desired signal and based on a comparison of the desired signal and a threshold signal.

11. The article of claim 10 further comprising instructions that if executed enable the communications system to:

attenuate the signal.

12. The article of claim 10 further comprising instructions that if executed enable the communications system to:

attenuate the desired signal.

* * * * *